(12) United States Patent
Yang

(10) Patent No.: US 11,963,428 B2
(45) Date of Patent: Apr. 16, 2024

(54) DISPLAY PANEL AND DISPLAY DEVICE

(71) Applicant: Wuhan China Star Optoelectronics Semiconductor Display Technology Co., Ltd., Hubei (CN)

(72) Inventor: Hanning Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 542 days.

(21) Appl. No.: 17/288,851

(22) PCT Filed: Mar. 16, 2021

(86) PCT No.: PCT/CN2021/081012
§ 371 (c)(1),
(2) Date: Apr. 26, 2021

(87) PCT Pub. No.: WO2022/170659
PCT Pub. Date: Aug. 18, 2022

(65) Prior Publication Data
US 2023/0200190 A1    Jun. 22, 2023

(30) Foreign Application Priority Data
Feb. 10, 2021   (CN) .......................... 202110185420.1

(51) Int. Cl.
*H10K 59/80*    (2023.01)
*G02B 5/30*     (2006.01)
*H10K 59/131*   (2023.01)

(52) U.S. Cl.
CPC ....... *H10K 59/8793* (2023.02); *G02B 5/3083* (2013.01); *H10K 59/131* (2023.02); *H10K 59/878* (2023.02)

(58) Field of Classification Search
CPC ............. H10K 59/8793; H10K 59/878; H10K 59/131; G02B 5/2083
See application file for complete search history.

(56) References Cited

U.S. PATENT DOCUMENTS

| | | | |
|---|---|---|---|
| 10,135,034 B1 * | 11/2018 | Bita | H10K 50/868 |
| 2010/0026940 A1 * | 2/2010 | Takegami | B29C 55/00 |
| | | | 264/1.6 |

FOREIGN PATENT DOCUMENTS

| | | |
|---|---|---|
| CN | 103207426 | 7/2013 |
| CN | 107003555 | 8/2017 |
| CN | 107221551 | 9/2017 |
| CN | 109477926 | 3/2019 |
| JP | 2003-167246 | 3/2022 |

* cited by examiner

*Primary Examiner* — Evan P Dzierzynski
*Assistant Examiner* — Nathaniel J Lee

(57) ABSTRACT

A display panel and a display device are disclosed. The display panel includes a display panel body and a polarizer, placed on the display panel body in a direction of outgoing light. The display panel body includes a metal layer having a reflection area corresponding to a first heading angle larger than a reflection area corresponding to a second heading angle. A light extinction of the polarizer corresponding to the first heading angle is greater than a light extinction of the polarizer corresponding to the second heading angle. This could remedy the light extinction of the polarizer in the second heading angle such that the display panel could have similar reflection rates and color shifts in all heading angles.

20 Claims, 5 Drawing Sheets

DISPLAY PANEL AND DISPLAY DEVICE

RELATED APPLICATIONS

This application is a National Phase of PCT Patent Application No. PCT/CN2021/081012 having International filing date of Mar. 16, 2021, which claims the benefit of priority of Chinese Patent Application No. 202110185420.1 filed on Feb. 10, 2021. The contents of the above applications are all incorporated by reference as if fully set forth herein in their entirety.

FIELD AND BACKGROUND OF THE INVENTION

The present invention relates to a display technology, and more particularly, to a display panel and a display device.

In contrast to liquid crystal displays (LED), organic light emitting displays (OLED) have high color gamut, high contrast, and good flexibility and is wearable. Thus, OLEDs become the development trend in the display industry. However, when the ambient light is incident into the OLED panel, the inside metal electrode reflects parts of the incident light. This introduces the issues of lower contrast and color shift. In order to reduce the influence of the ambient light, a polarizer is often pasted on the OLED panel.

As the development progress of the display technology and the higher demands for the display quality, OLED products having lower reflection rate and lower color shift are expected. In order to achieve lower reflection rate and lower color shift for a large view angle (black uniformity in a large view angle), a conventional solution is to adjust the coefficients of the polarizer. However, this improvement is limited, which means that the improved OLED products still cannot have a satisfying black uniformity.

Therefore, the black uniformity of the conventional OLED products needs to be further improved.

SUMMARY OF THE INVENTION

One objective of an embodiment of the present invention is to provide a display panel and a display device, which could improve the black uniformity of the OLED products.

According to an embodiment of the present invention, a display panel is disclosed. The display panel comprises a display panel body and a polarizer, placed on the display panel body in a direction of outgoing light. The display panel body comprises a metal layer having a reflection area corresponding to a first heading angle larger than a reflection area corresponding to a second heading angle. A light extinction of the polarizer corresponding to the first heading angle is greater than a light extinction of the polarizer corresponding to the second heading angle.

According to an embodiment of the present invention, the display panel body further comprises a substrate. The metal layer is placed on the substrate and the metal layer comprises a first source/drain layer and a second source/drain layer. The first source/drain layer is placed on the substrate. The first source/drain layer includes at least one first signal line along the second heading angle. The second source/drain layer is placed on the first source/drain layer. The second source/drain layer includes at least one second signal line parallel to the first signal line. An orthogonal projection of the second signal line on the substrate at least partially overlaps with an orthogonal projection of the first signal line on the substrate such that a reflection area of the metal layer in the first heading angle is larger than a reflection area of the metal layer in the second heading angle.

According to an embodiment of the present invention, the second signal line comprises a first sub signal line and a second sub signal line parallel to the second heading angle.

According to an embodiment of the present invention, the second signal line comprises a first sub signal line and a second sub signal line parallel to the second heading angle and at least one of the first sub signal line and the second sub signal line has a protrusion part.

According to an embodiment of the present invention, the first signal line comprises a third sub signal line and a fourth sub signal line parallel to the second heading angle.

According to an embodiment of the present invention, the first signal line is placed correspondingly to the first sub signal line or the second sub signal line.

According to an embodiment of the present invention, a width of the second signal line is equal to a width of the first signal line.

According to an embodiment of the present invention, an orthogonal projection of the first signal line on the substrate overlaps with an orthogonal projection of the second signal line on the substrate.

According to an embodiment of the present invention, a number of the second signal lines is greater than a number of the first signal lines.

According to an embodiment of the present invention, the polarizer comprises a line polarization layer and a phase compensation layer, and the phase compensation layer is located at a side of the line polarization layer, which faces the display panel body.

According to an embodiment of the present invention, the phase compensation layer comprises stacked a half-wave plate and a quarter-wave plate.

According to an embodiment of the present invention, a phase delay coefficient of the half-wave plate is between 100 nm to 300 nm, and a phase delay coefficient of the quarter-wave plate is between 50 nm to 200 nm.

According to an embodiment of the present invention, the phase compensation layer comprises stacked a quarter-wave plate and a C-type phase compensation layer.

According to an embodiment of the present invention, a phase delay coefficient of the quarter-wave plate is between 50 nm to 200 nm and a phase delay coefficient of the C-type phase compensation layer is between 0 nm to 200 nm.

According to an embodiment of the present invention, a display device comprises a display panel. The display panel includes a display panel body and a polarizer, placed in a direction of outgoing light of the display panel body. The display panel body includes a metal layer having a reflection area corresponding to a first heading angle larger than a reflection area corresponding to a second heading angle. A light extinction of the polarizer corresponding to the first heading angle is greater than a light extinction of the polarizer corresponding to the second heading angle.

According to an embodiment of the present invention, the display panel body further comprises a substrate. The metal layer is placed on the substrate and the metal layer comprises a first source/drain layer and a second source/drain layer. The first source/drain layer is placed on the substrate. The first source/drain layer includes at least one first signal line along the second heading angle. The second source/drain layer is placed on the first source/drain layer. The second source/drain layer includes at least one second signal line parallel to the first signal line. An orthogonal projection of the second signal line on the substrate at least partially overlaps with an orthogonal projection of the first signal line on the substrate such that a reflection area of the metal layer in the first heading angle is larger than a reflection area of the metal layer in the second heading angle.

According to an embodiment of the present invention, a width of the second signal line is equal to a width of the first signal line.

According to an embodiment of the present invention, the polarizer comprises a line polarization layer and a phase compensation layer, and the phase compensation layer is located at a side of the line polarization layer, which faces the display panel body.

According to an embodiment of the present invention, the phase compensation layer comprises stacked a half-wave plate and a quarter-wave plate.

According to an embodiment of the present invention, the phase compensation layer comprises stacked a quarter-wave plate and a C-type phase compensation layer.

According to an embodiment, a display panel and a display device comprise a line polarization layer and a phase compensation layer, which make a light extinction of the polarizer corresponding to the first heading angle greater than a light extinction of the polarizer corresponding to the second heading angle. This could improve the reflection rate and color shift of the display panel in a certain heading angle. Furthermore, the display panel has two source/drain layers. Each of the source/drain layers are arranged along the second heading angle. In addition, the orthogonal projection of the second signal line of the second source/drain layer on the substrate at least partially overlaps with the orthogonal projection of the first signal line of the first source/drain layer on the substrate such that the second signal line covers different areas of the first signal line in different heading angles to form different metal reflection areas. This could remedy the light extinction of the polarizer in the second heading angle such that the display panel could have similar reflection rates and color shifts in all heading angles. Therefore, the black uniformity of the display panel could be raised.

BRIEF DESCRIPTION OF THE SEVERAL VIEWS OF THE DRAWINGS

Embodiments of the present application are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present application, and are not to be construed as limiting the scope of the present application.

DESCRIPTION OF SPECIFIC EMBODIMENTS OF THE INVENTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
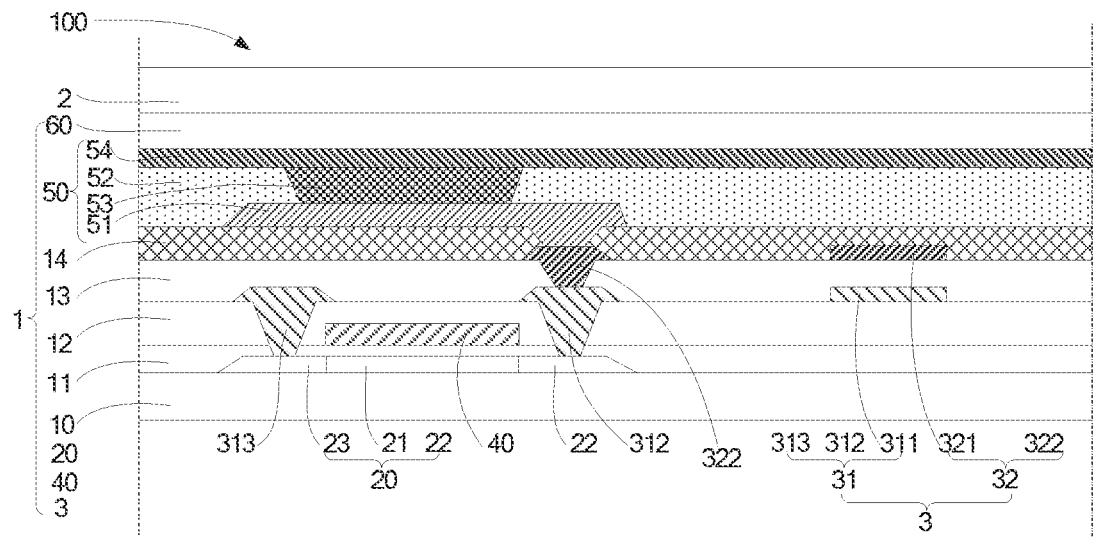
FIG. 1 is a diagram of a cross section of a display panel according to an embodiment of the present invention.
Figure 2:
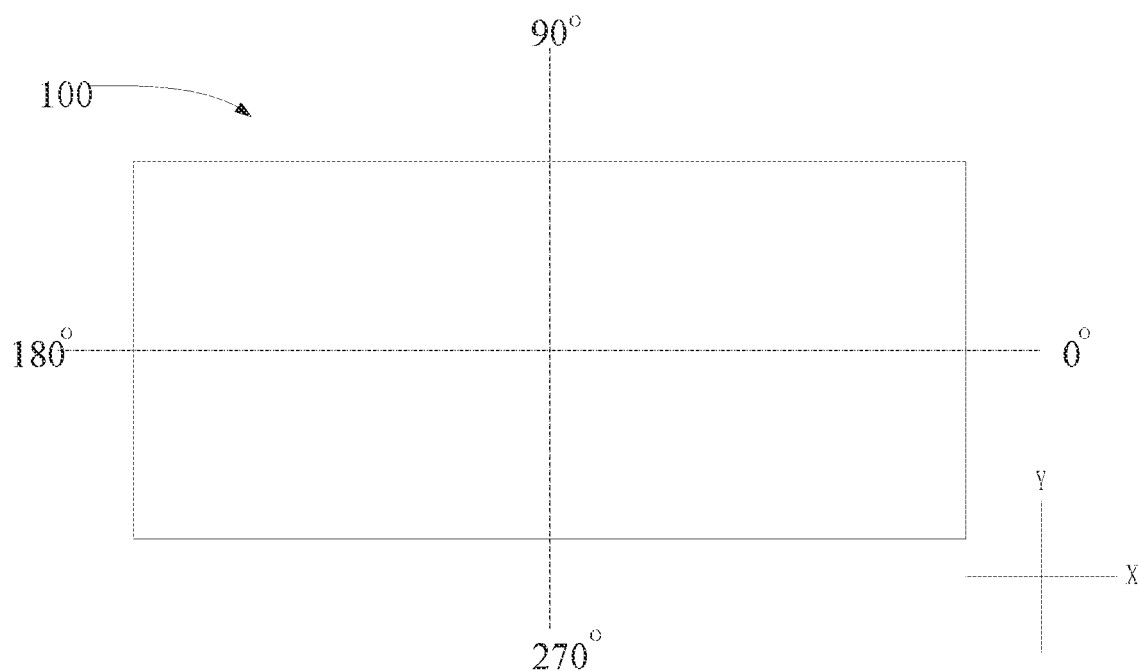
FIG. 2 is a diagram of a top view of a display panel according to an embodiment of the present invention.

Please refer to FIG. 1 and FIG. 2. FIG. 1 is a diagram of a cross section of a display panel according to an embodiment of the present invention. FIG. 2 is a diagram of a top view of a display panel according to an embodiment of the present invention. The display panel 100 comprises a display body 1 and a polarizer 2. The metal layer of the display panel body 1 has a reflection area corresponding to a first heading angle larger than a reflection area corresponding to a second heading angle. A light extinction of the polarizer 2 corresponding to the first heading angle is greater than a light extinction of the polarizer corresponding to the second heading angle.

The first heading angle comprises 0 degree and 180 degrees. The second heading angle comprises 90 degrees and 270 degrees. Here, the 0 degree and the 180 degrees represent the horizontal direction of the display panel 100. The 90 degree and the 270 degrees represent the vertical direction of the display panel 100. Therefore, the first heading angle represents the horizontal direction X and the second heading angle represents the vertical direction Y.

The display panel body 1 comprises a substrate 10. The metal layer 3 is placed on the substrate 10. Optionally, the metal layer 3 comprises a first source/drain layer 31 and a second source/drain layer 32 but this is not a limitation of the present invention. The metal layer 3 could be another metal layer on the display panel body 1.

The first source/drain layer 31 is placed on the substrate 10. The first source/drain layer comprises at least one first signal line 311 along the second heading angle. That is, the first signal line 311 is distributed along the vertical direction Y. The second source/drain layer 32 is placed on the first source/drain layer 32. The second source/drain layer 32 comprises at least one second signal line 321 parallel to the first signal line 311. The orthogonal projection of the second signal line 321 on the substrate 10 at least partially overlaps with the orthogonal projection of the first signal line 311 on the substrate 10 such that a reflection area of the metal layer 3 in the first heading angle is larger than a reflection area of the metal layer 3 in the second heading angle.

The polarizer 2 is placed in a direction of outgoing light of the display panel body 1. The polarizer could absorb a part of the ambient light to prevent the ambient light from being reflected by the metal line inside the display panel body 1 such that the reflection rate is reduced and the contrast of the display panel 100 is raised. The light extinction of the polarizer 2 corresponding to the first heading angle is greater than the light extinction of the polarizer 2 corresponding to the second heading angle. The above-mentioned light extinction represents the capability of the polarizer 2 for absorbing the ambient light. The greater the light extinction is, the more ambient light is absorbed such that the lower reflection could be achieved.

The display panel 1 has two layers of source/drain layers. The signal lines of each of the source/drain layers are arranged along the second heading angles. The orthogonal projection of the first signal line 311 of the first source/drain layer 31 on the substrate overlaps with the orthogonal projection of the second signal line 321 of the second source/drain layer 32 on the substrate to compensate the light extinction of the polarizer 2 in the second heading angle. In this way, the display panel 100 could have a similar reflection rate and a color shift in all heading angles and thus the black uniformity of the display panel 100 is raised.

Figure 3:
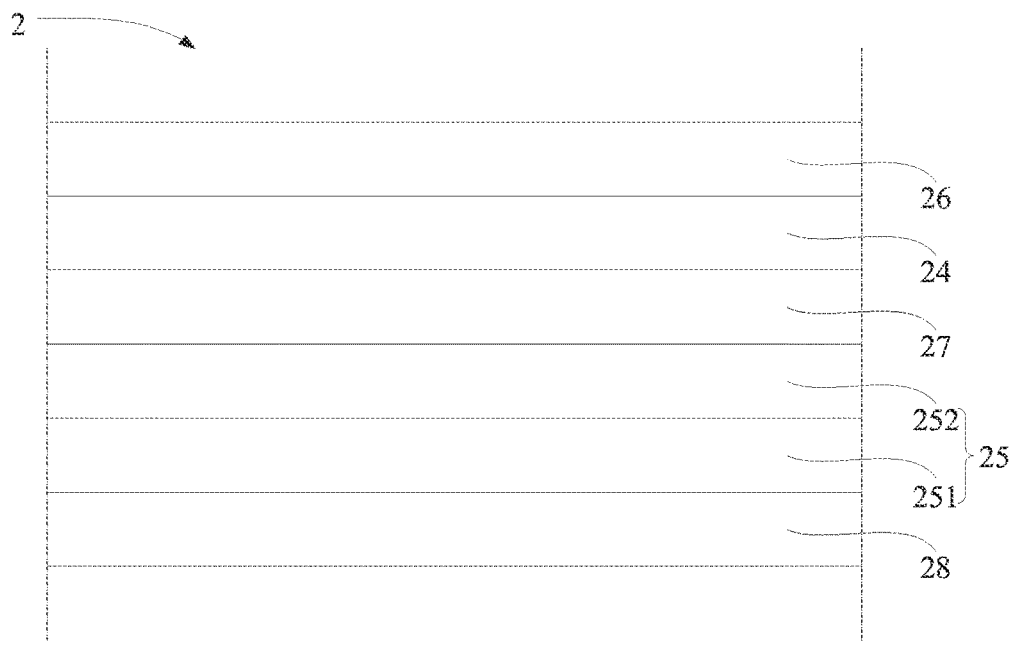
FIG. 3 is a diagram of a cross section of a polarizer according to an embodiment of the present invention.

Please refer to FIG. 1 and FIG. 3. FIG. 3 is a diagram of a cross section of a polarizer according to an embodiment of the present invention. The polarizer 2 comprises a line polarization layer 24 and a phase compensation layer 25. The phase compensation layer 25 is located at a side of the line polarization layer 24, which faces the display panel body 1. Here, the polarizer 2 further comprises a first protection layer 26 located at a side of the line polarization layer 24, which is comparatively far away from the phase compensation layer 25. The polarizer 2 further comprises a second protection layer between the line polarization layer 24 and the phase compensation layer 25 and a pressure sensitive adhesive (PSA) layer 28 at a side of the phase compensation layer 25, which is comparatively far away from the line polarization layer 24.

The first protection layer 26 and the second protection layer 27 comprises a material of Triacetyl cellulose (TAC) for protecting the line polarization layer 24, raising the mechanical performance of the line polarization layer 24, and prevent the line polarization layer 24 from shrinking. The line polarization layer 24, the PVA layer, is made with Polyvinyl alcohol and is used for polarizing light. The PSA layer 28 is placed at a side of the phase compensation layer as an adhesive layer to connect layers.

The phase compensation layer 25 comprises stacked a half-wave plate 252 and a quarter-wave plate 251. The half-wave plate 252 is placed at a side of the quarter-wave plate 251, which is comparatively far away from the line polarization layer 24. The half-wave plate 252, the ½-wave plate, is used to rotate the polarized light to generate a phase delay. The quarter-wave 251 could transform the line polarized light into a circularly polarized light to achieve the anti-reflection function of the polarizer 2. Optionally, the phase delay coefficient of the half-wave plate 252 is between 100 nm to 300 nm, and the phase delay coefficient of the quarter-wave plate is between 50 nm to 200 nm. Because of the difference between the refractive indexes of the polarizer 2 in different heading angles, the polarizer 2 has different light extinctions in different heading angle under a huge view angle. That is, the light extinction of the first heading angle is greater than the light extinction of the second heading angle. In other words, the display panel may have a better light distinction, lower reflection rate and lower color shift in the 0-degree and 180-degree heading angles for the large view angle. In contrast, the display panel may have a comparatively lower light distinction, higher reflection rate and higher color shift in the 90-degree and 270-degree heading angles for the large view angle.

The polarizer 2 is placed in a direction of outgoing light of the display panel body 1. Through the phase compensation layer 25, the reflection rate and the color shift of the display panel 100 in a specific heading angle could be improved. The direction of outgoing light of the display panel body 1 represents the side of the display panel body 1, which is able to display the images.

Please refer to FIG. 1. The display panel body 1 further comprises an active layer 20 and a gate layer 40 between the substrate 10 and the first source/drain layer 31, and insulating layers over a light emitting functional layer 50 between each of the layers, such as a gate insulating layer 11 between the active layer 20 and the gate layer 40, a first interlayer insulating layer 12 between the first source/drain layer 31 and the second source/drain layer 3, a second interlayer insulating layer 13 between the first source/drain layer 31 and the second source/drain layer 32, and a planarization layer 14 between the second source/drain layer 32 and the light emitting functional layer 50.

The substrate 10 could be a solid substrate or a flexible substrate. If the substrate 10 is a solid substrate, it could comprise a glass substrate or other solid substrates. If the substrate 10 is a flexible substrate, it could comprise Polyimide (PI) thin film, a super thin glass film, or other flexible substrates.

A buffer layer (not shown) is placed between the substrate 10 and the active layer 20. The buffer layer could prevent the unexpected impurities or pollutions (such as moisture or oxygen) from diffusing from the substrate to the devices that could be damaged by these impurities or pollutions. Furthermore, the buffer layer could provide a flat top surface.

The active layer 20 is placed on the buffer layer. The active layer 20 comprises a channel region 21 and a source doped region 22 and drain doped region 23 located at both sides of the channel region 21.

The gate insulating layer 11 covers the active layer 20 and the buffer layer. The gate layer 40 is placed on the gate insulating layer 11. The gate pattern of the gate layer 40 is corresponding to the channel region 21 of the active layer 20. The interlayer insulating layer 12 covers the gate layer 40 and the gate insulating layer 11. The first source/drain layer 31 is placed on the first interlayer insulating layer 12. The first source/drain layer 31 comprises a first source 312, a first drain 313 and a first signal line 311. The first signal line 311, the first source 312 and the first drain 313 are placed in the same layer. The first source 312 is connected to the source doped region 22 through a via of the first interlayer insulating layer 12. The first drain 313 is connected to the drain doped region 23 through another via of the interlayer insulating layer 12.

The second interlayer insulating layer 13 covers the first source/drain layer 31 and the first insulating layer 12. The second source/drain layer 32 is placed on the second interlayer insulating layer 13. The second source/drain layer 32 comprises a second source 322 and a second signal line 321. The second signal line 321 and the second source 322 are placed in the same layer. The second source 322 is connected to the first source 312 through a via of the second interlayer insulating layer 13. It should be understood that the above-mentioned connection configuration is not a limitation of the present invention. In the actual implementation, the second source 322 could be further connected to the first drain 313.

Figure 4:
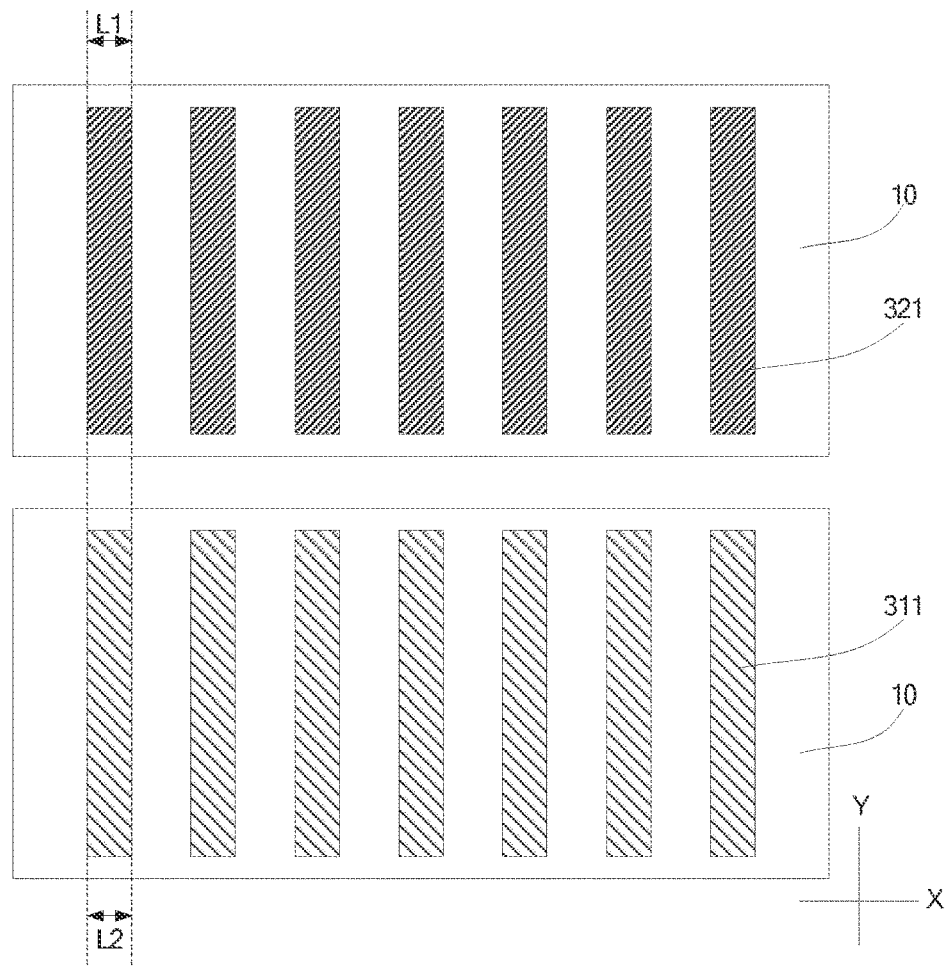
FIG. 4 is a diagram of a top view of a layout of a first signal line and a second signal line according to an embodiment of the present invention.

Please refer to FIG. 1 and FIG. 4. FIG. 4 is a diagram of a top view of a layout of the first signal line and the second signal line according to an embodiment of the present invention. The first signal line 311 and the second signal line 321 are arranged along the vertical direction Y. The orthogonal projection of the second signal line 321 on the substrate 10 at least partially overlaps with the orthogonal projection of the first signal line 311 on the substrate 10 such that the second signal line 312 could cover part of the first signal line 311.

The surface shape of the first signal line 311 and the second signal line 321 comprises a rectangular. The rectangular surface shape of the first signal line 311 and the second signal line 321 could reduce the manufacturing difficulties.

The cross sections of the first signal line 311 and the second signal line 321 could be in rectangular or trapezoid. It is in rectangular shown in FIG. 1.

Figure 5:
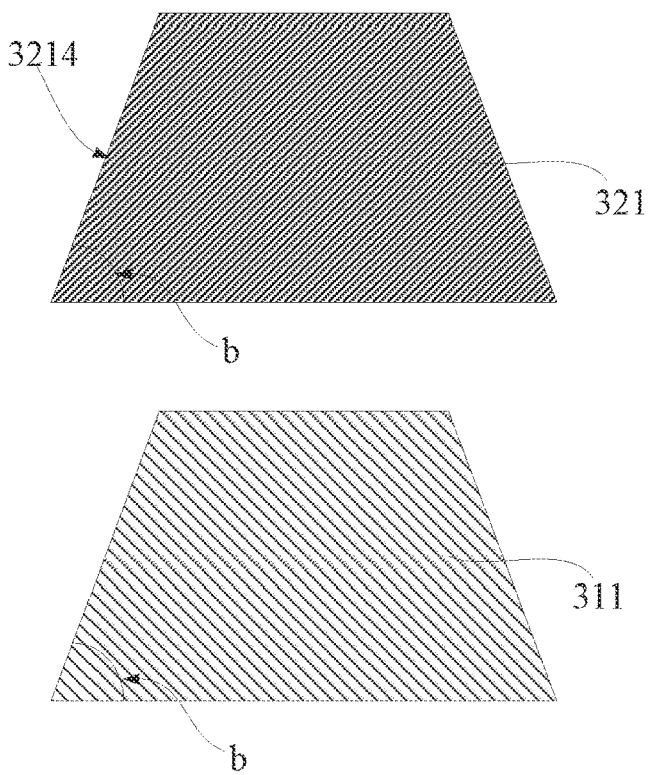
FIG. 5 is a diagram of a cross section of a first signal line and a second signal line according to an embodiment of the present invention.

Please refer to FIG. 5. When cross sections of the first signal line 311 and the second signal line 321 are in trapezoid, the side 3214 of the trapezoid reflects the ambient light. Therefore, the smaller the bottom angle b is, the lower the reflection rate is. Optionally, the width L1 of the second signal line 312 is equal to the width L2 of the first signal line 311. However, this is not a limitation of the present invention. In the actual implementation, the width L1 of the second signal line 312 could be not equal to the width L2 of the first signal line 311.

The orthogonal projection of the first signal line 311 on the substrate 10 fully overlaps with the orthogonal projection of the second signal line 321 on the substrate 10. In this way, the second signal line 321 could better cover the first signal line 311.

The number of the second signal lines 321 is greater than or equal to the number of the first signal lines 311. When the number of the second signal lines 321 is greater than or equal to the number of the first signal lines 311, the first signal lines 311 are placed correspondingly to part of the second signal lines 321. When the number of the second signal lines 321 is equal to the number of the first signal lines 311, the first signal lines 311 are placed correspondingly to the second signal lines 321. As shown in FIG. 4, the number of the second signal lines 321 is equal to the number of the first signal lines 311 and the orthogonal projection of each of the first signal lines 311 on the substrate 10 fully overlaps with the orthogonal projection of each of the first signal lines 311.

Each of the first signal line 311 and the second signal line 321 could be a data signal line or a power line. Specifically, one of the first signal line 311 and the second signal line 321 is a data signal line and the other one of first signal line 311 and the second signal line 321 is a power line.

Through placing the first signal line 311 and the second signal line 321 along the second heading angle and arranging the orthogonal projection of the first signal line 311 on the substrate 10 to overlap with the orthogonal projection of the second signal line 321, the second signal line 321 covers different areas of the first signal lines 311 in different angles to form different metal reflection areas. This makes the metal reflection area of the display panel body 1 in the first heading angle larger than the metal reflection area of the display panel body 1 in the second heading angle to compensate the light extinction of the polarizer 2 in the second heading angle.

Figure 6:
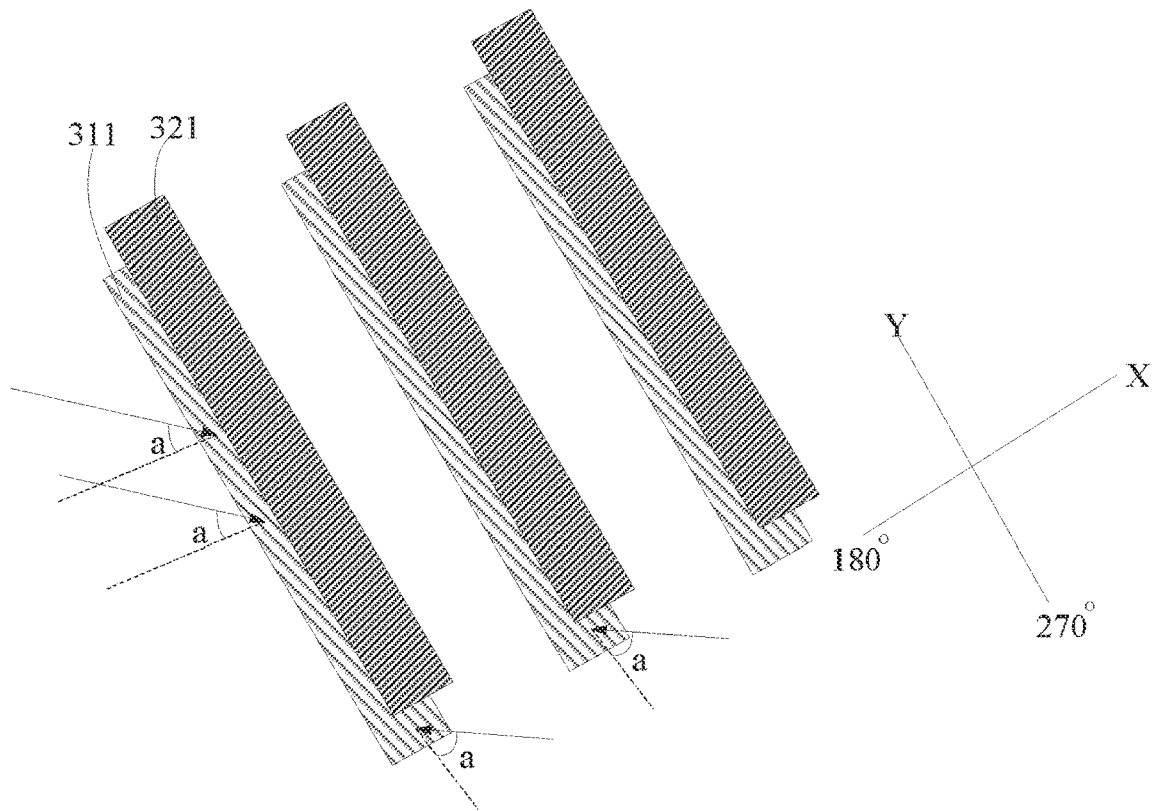
FIG. 6 is a diagram showing a spatial relationship between a first signal line and a second signal line according to an embodiment of the present invention.

Please refer to FIG. 6. FIG. 6 is a diagram showing a spatial relationship between the first signal line and the second signal line according to an embodiment of the present invention. In FIG. 6, the metal reflection area of the display panel body in 180-degree heading angle and the metal reflection area of the display panel body in 270-degree heading angle are taken as an example.

In the 180-degree heading angle, the ambient light is incident to the first signal line 311 and the second signal line 321 at a predetermined angle a. Because the second signal line 321 covers a part of the first signal line 311, the covered part of the first signal line 311 does not receive the ambient light. Therefore, the metal reflection area in the 180-degree heading angle comprises the surface of the second signal line 321 and the surface of the first signal line 311 not uncovered by the second signal line 321.

In the 270-degree heading angle, the ambient light is incident to the first signal line 311 and the second signal line 321 at a predetermined angle a. Because the second signal line 321 covers a part of the first signal line 311, the covered part of the first signal line 311 does not receive the ambient light. Therefore, the metal reflection area in the 180-degree heading angle comprises the surface of the second signal line 321 and the surface of the first signal line 311 not uncovered by the second signal line 321.

Because the first signal lines 311 and the second signal lines 321 are all arranged along the second heading angle (the vertical direction), the area of the first signal line 311 not covered by the second signal line 321 in the 270-degree heading angle is smaller than the area of the first signal line 311 not covered by the second signal line 321 in the 180-degree heading angle. Similarly, the blocking effect of the second signal line 321 in the 0-degree heading angle is identical to the blocking effect of the second signal line 321 in the 180-degree heading angle. The blocking effect of the second signal line 321 in the 90-degree heading angle is identical to the blocking effect of the second signal line 321 in the 270-degree heading angle. Therefore, the metal reflection area of the display panel body 1 in the first heading angle is larger than the metal reflection area of the display panel body 1 in the second heading angle.

In this embodiment, "placed in the same layer" means that a film layer of the same material is patterned to form at least two characteristics such that two different characteristics are placed in the same layer. For example, in this embodiment, the second signal line 321 and the second source 322 are formed by patterning the same conductive film layer such that the second signal line 321 and the second source 322 are placed in the same layer.

The planarization layer 14 covers the second source/drain layer 32 and the second interlayer insulating layer 13. The light emitting functional layer 50 is placed on the planarization layer 14. The light emitting functional layer 50 comprises a pixel electrode 51, a pixel definition layer 52, an light emitting material layer 53, and a cathode layer 54. The pixel electrode 51 is connected to the second source 322 through a via of the planarization layer 14. The pixel definition layer 52 covers the pixel electrode 51 and the planarization layer 14 and is patterned to form a pixel opening. The pixel opening exposes parts of the pixel electrodes 51 to define the region to place the light emitting material. The light emitting material layer 53 is formed in the pixel opening of the pixel definition layer 52 by a printing process. The cathode layer 54 covers the light material layer 53 and the pixel definition layer 52. The light emitting material layer 53 generates light under the operation of the pixel electrode 51 and the cathode layer 53 such that the display panel body 1 could display images using the pixels.

The pixel electrode 51 could be a transparent electrode or a reflection electrode. If the pixel electrode 51 is a transparent electrode, then the pixel electrode 51 could be formed with ITO, IZO, ZnO or In2O3. If the pixel electrode 51 is a reflection electrode, then the pixel electrode 51 could be made with Ag, Mg, Al, Pt, Pd, Au, Ni, Nd, Ir, Cr, or their combination or a layer formed with ITO, IZO, ZnO or In2O3. However, this is not a limitation of the present invention. The pixel electrode 51 could be made with any material and could be a single-layer or multi-layer structure.

The cathode layer 54 is made with transparent conductive material to raise the transparent rate of the light emitting material layer 42. For example, the cathode layer 54 could be a transparent conductive layer made with a metal of low work function (such as Li, Ca, LiF/Ca, LiF/Al, Al, Ag, Mg or their combination) and/or a layer made with ITO, IZO, ZnO or In2O3. If the pixel electrode 51 is a reflection layer, the light utilization rate of the light emitting material layer 53 could be further raised.

The light emitting function layer 50 could further an HIL and an HTL between the light emitting material layer 53 and the pixel electrode 51 and an EIL and ETL between the light emitting material layer 53 and the cathode layer 54.

The display panel body 1 could comprise a package layer 60 on the light emitting functional layer 50. The package layer 60 could be formed by a film package process. The film package could have three orderly stacked layers or more stacked layers, including a first inorganic package layer, an organic package, and a second inorganic package for protecting the light emitting material layer 53 of the light emitting function layer 50 from the intrusion of water or oxygen.

The display pane 100 could further comprise a touch layer (not shown) between the polarizer 2 and the display panel body 1. The touch layer is directly placed on the package layer 60 and adopts the DOT touch control solution to achieve the touch control function. Please note, this is not a limitation of the present invention. The display panel 100 could have an external touch control solution.

Figure 7:
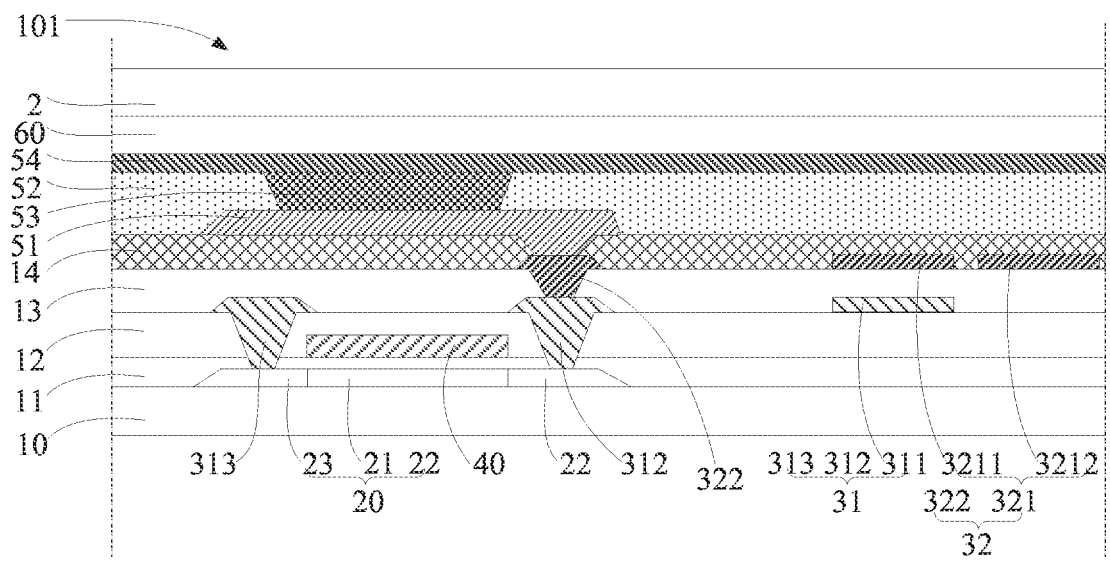
FIG. 7 is a diagram of a cross section of a display panel according to another embodiment of the present invention.
Figure 8:
FIG. 8 is a diagram of a cross section of a polarizer according to another embodiment of the present invention.
Figure 9:
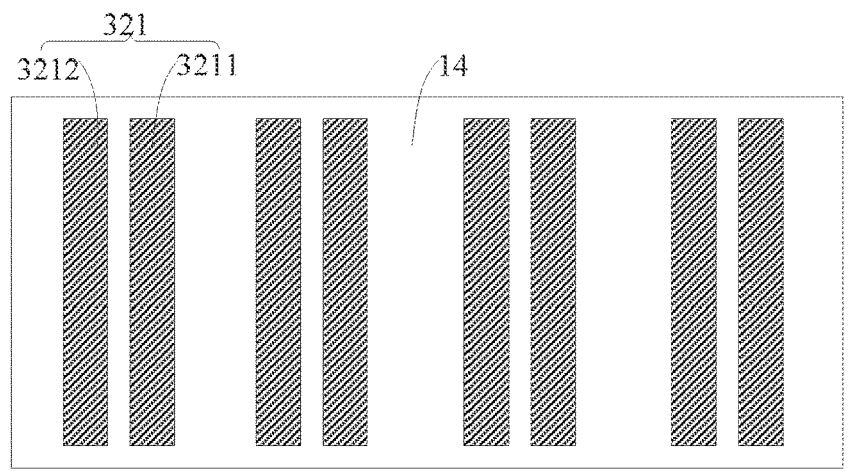
FIG. 9 is a diagram of a top view of a second signal line according to an embodiment of the present invention.

Please refer to FIG. 7 to FIG. 9. FIG. 7 is a diagram of a cross section of a display panel according to another embodiment of the present invention. FIG. 8 is a diagram of a cross section of a polarizer according to another embodiment of the present invention. FIG. 9 is a diagram of a top view of the second signal line according to an embodiment of the present invention. In contrast to the above embodiment, the second signal line 321 comprises a first sub signal line 3211 and a second sub signal line 3212 parallel to the second heading angle. The first sub signal line 3211 and the second sub signal line 3212 are correspondingly arranged.

The polarizer 2 of the display panel 101 is placed in the direction of outgoing light of the display panel body 1. The polarizer 2 comprises a line polarization layer 24 and a phase compensation layer 25. The phase compensation layer 25 is placed at a side of the line polarization layer 24, which faces the display panel body 1. The compensation layer 25 comprises stacked a quarter-wave plate 251 and a C-type phase compensation layer 253. The phase delay coefficient of the quarter-wave plate is between 50 nm to 200 nm and the phase delay coefficient of the C-type phase compensation layer is between 0 nm to 200 nm.

Because of the refractive index difference of the polarizer 2 in different heading angles, the polarizer 2 has different light distinctions in different heading angles for a large view angle. That is, the polarizer 2 may have a better light distinction, lower reflection rate and lower color shift in the 0-degree and 180-degree heading angles for the large view angle. In contrast, the polarizer 2 may have a comparatively lower light distinction, higher reflection rate and higher color shift in the 90-degree and 270-degree heading angles for the large view angle.

The first signal line 311 and the second signal line 321 are arranged along the second heading angle. That is, the first signal line 311 and the second signal line 321 are arranged along the vertical direction Y and the orthogonal projection of the second signal line 321 on the substrate 10 at least partially overlaps with the orthogonal projection of the first signal line 311 on the substrate 10 such that the second signal line 312 could cover part of the first signal line 311. Optionally, as shown in FIG. 7, the first signal line 311 is placed correspondingly to the first sub signal line 3211 of the second signal line 321.

The width of the first sub signal line 3211 is equal to the width of the first signal line 311. Please note, this is not a limitation of the present invention. The width of the first sub signal line 3211 could be not equal to the width of the first signal line 311.

The orthogonal projection of the first signal line 311 on the substrate 10 fully overlaps with the orthogonal projection of the first sub signal line 3211 on the substrate 10. In this way, the second signal line 321 could better cover the first signal line 311.

The number of the second signal lines 321 is greater than or equal to the number of the first signal lines 311 to make sure that the second signal lines 321 could well cover the first signal lines 311.

Each of the first signal line 311 and the second signal line 321 could be a data signal line or a power line. Specifically, one of the first signal line 311 and the second signal line 321 is a data signal line and the other one of first signal line 311 and the second signal line 321 is a power line. When the second signal line 321 is a data signal line and/or a power line, each of the first sub signal line 3211 and the second sub signal line 3212 could be the data signal line and/or the power line.

Through placing the first signal line 311 and the second signal line 321 along the second heading angle and arranging the orthogonal projection of the first signal line 311 on the substrate 10 to overlap with the orthogonal projection of the first sub signal line 3211, the second signal line 321 covers different areas of the first signal lines 311 in different angles to form different metal reflection areas. This makes the metal reflection area of the display panel 101 in the first heading angle larger than the metal reflection area of the display panel 101 in the second heading angle to compensate the light extinction of the polarizer 2 in the second heading angle. Further illustrations had been disclosed in the above embodiments and thus omitted here.

Figure 10:
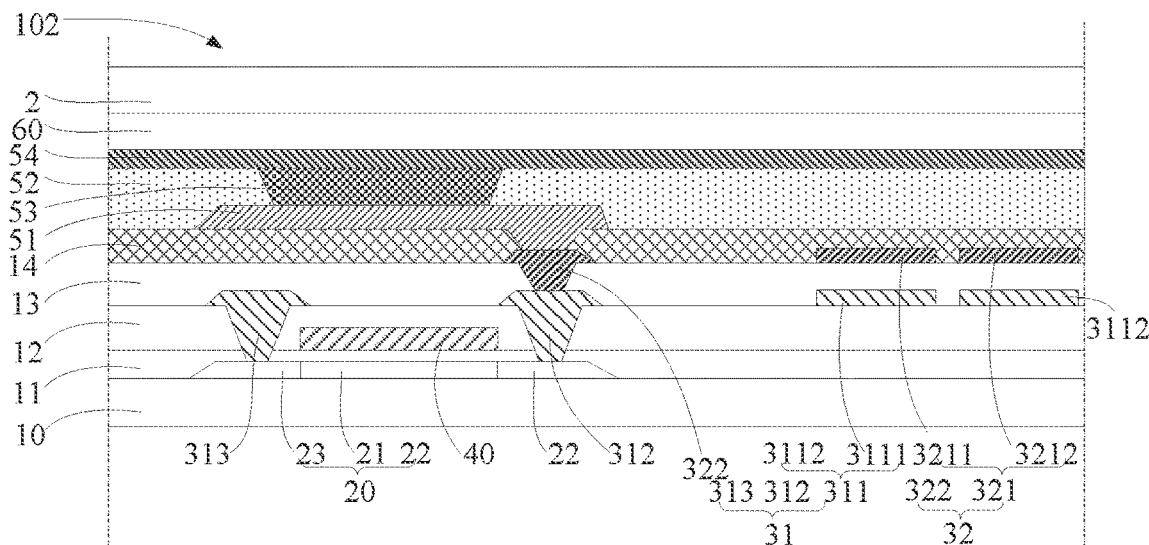
FIG. 10 is a diagram of a cross section of a display panel according to the other embodiment of the present invention.
Figure 11:
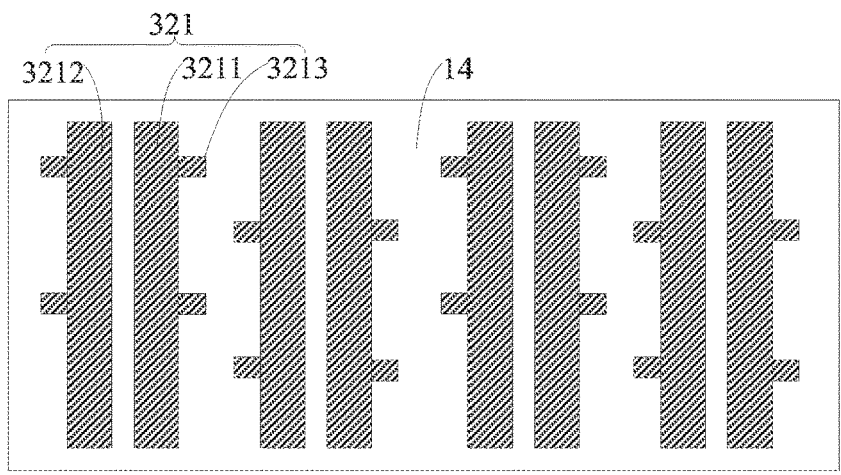
FIG. 11 is a diagram a top view of a second signal line according to another embodiment of the present invention.

Please refer to FIG. 10 and FIG. 11. FIG. 10 is a diagram of a cross section of a display panel according to the other embodiment of the present invention. FIG. 11 is a diagram a top view of a second signal line according to another embodiment of the present invention. In contrast to the above embodiment, the second signal line 321 comprises a first sub signal line 3211 and a second sub signal line 3212 parallel to the second heading angle. In addition, at least one of the first sub signal line 3211 and the second sub signal line 3212 has a protrusion part. The first signal line 311 comprises a third sub signal line 3111 and a fourth sub signal line 3112 parallel to the second heading angle.

The first sub signal line 3211 is placed correspondingly to the third sub signal line 3111. The second sub signal line 3212 is placed correspondingly to the fourth sub signal line 3212.

The width of the third sub signal line 3111 is equal to the width of the first sub signal line 3211. The width of the fourth sub signal line 3112 is equal to the width of the second sub signal line 3212.

The orthogonal projection of the first sub signal line 3211 on the substrate 10 full overlaps with the orthogonal projection of the third sub signal line 3111 on the substrate 10.

The orthogonal projection of the second sub signal line 3212 on the substrate 10 full overlaps with the orthogonal projection of the fourth sub signal line 3112 on the substrate 10.

The number of the second signal lines 321 is greater than or equal to the number of the first signal lines 311.

Each of the first signal line 311 and the second signal line 321 could be a data signal line or a power line. Specifically, one of the first signal line 311 and the second signal line 321 is a data signal line and the other one of first signal line 311 and the second signal line 321 is a power line. When the second signal line 321 is a data signal line and/or a power line, each of the first sub signal line 3211 and the second sub signal line 3212 could be the data signal line and/or the power line. When the first signal line 311 is a data signal line and/or a power line, each of the third sub signal line 3111 and the fourth sub signal line 3112 could be the data signal line and/or the power line.

Through placing the first signal line 311 and the second signal line 321 along the second heading angle and arranging the orthogonal projection of the first signal line 311 on the substrate 10 to overlap with the orthogonal projection of the first sub signal line 3211, the second signal line 321 covers different areas of the first signal lines 311 in different angles to form different metal reflection areas. This makes the metal reflection area of the display panel 102 in the first heading angle larger than the metal reflection area of the display panel 102 in the second heading angle to compensate the light extinction of the polarizer 2 in the second heading angle. Further illustrations had been disclosed in the above embodiments and thus omitted here.

When the second signal line 321 comprises the first sub signal line 3211 and the second sub signal line 3212 parallel to the second heading angle, the first signal line 3212 could comprise the third sub signal line 311 and the fourth signal line 3112 parallel to the second heading angle. The first sub signal line 3211 is placed correspondingly to the third sub signal line 3111. The second sub signal line 3212 is placed correspondingly to the fourth sub signal line 3112.

Or, when the second signal line 321 comprises the first sub signal line 3211 and the second sub signal line 3212 parallel to the second heading angle and at least one of the first sub signal line 3211 and the second sub signal line 3212 comprises a protrusion part 3213, the first signal line 311 could comprises the third sub signal line 311 and the fourth signal line 3112 parallel to the second heading angle and at least one of the third sub signal line 311 and the fourth signal line 3112 comprises a protrusion part 3213. The first sub signal line 3211 is placed correspondingly to the third sub signal line 3111. The second sub signal line 3212 is placed correspondingly to the fourth sub signal line 3112.

Or, when the second signal line 321 comprises the first sub signal line 3211 and the second sub signal line 3212 parallel to the second heading angle and at least one of the first sub signal line 3211 and the second sub signal line 3212 comprises a protrusion part 3213, the first signal line 311 is placed correspondingly to the first sub signal line 3211 or the second sub signal line 3212. Further illustrations had been disclosed in the above embodiments and thus omitted here.

According to an embodiment of the present invention, a display device is disclosed. The display device comprises a display panel of any of the above embodiments. The display panel is bonded with a circuit board, a cover plate covering the display panel, and/or other components.

The present disclosure provides a display panel and a display device comprising a line polarization layer and a phase compensation layer, which make a light extinction of the polarizer corresponding to the first heading angle greater than a light extinction of the polarizer corresponding to the second heading angle. This could improve the reflection rate and color shift of the display panel in a certain heading angle. Furthermore, the display panel has two source/drain layers. Each of the source/drain layers are arranged along the second heading angle. In addition, the orthogonal projection of the second signal line of the second source/drain layer on the substrate at least partially overlaps with the orthogonal projection of the first signal line of the first source/drain layer on the substrate such that the second signal line covers different areas of the first signal line in different heading angles to form different metal reflection areas. This could remedy the light extinction of the polarizer in the second heading angle such that the display panel could have similar reflection rates and color shifts in all heading angles. Therefore, the black uniformity of the display panel could be raised.

Above are embodiments of the present invention, which does not limit the scope of the present invention. Any modifications, equivalent replacements or improvements within the spirit and principles of the embodiment described above should be covered by the protected scope of the invention.

What is claimed is:

1. A display panel, comprising:
   a display panel body, comprising a metal layer having a reflection area corresponding to a first heading angle larger than a reflection area corresponding to a second heading angle; and
   a polarizer, placed in a direction of outgoing light of the display panel body; wherein a light extinction of the polarizer corresponding to the first heading angle is greater than a light extinction of the polarizer corresponding to the second heading angle.

2. The display panel of claim 1, wherein the display panel body further comprises a substrate, the metal layer is placed on the substrate and the metal layer comprises:
   a first source/drain layer, placed on the substrate, the first source/drain layer comprising at least one first signal line along the second heading angle;
   a second source/drain layer, placed on the first source/drain layer, the second source/drain layer comprising at least one second signal line parallel to the first signal line;
   wherein an orthogonal projection of the second signal line on the substrate at least partially overlaps with an orthogonal projection of the first signal line on the substrate such that a reflection area of the metal layer in the first heading angle is larger than a reflection area of the metal layer in the second heading angle.

3. The display panel of claim 2, wherein the second signal line comprises a first sub signal line and a second sub signal line parallel to the second heading angle.

4. The display panel of claim 3, wherein the first signal line is placed correspondingly to the first sub signal line or the second sub signal line.

5. The display panel of claim 2, wherein the second signal line comprises a first sub signal line and a second sub signal line parallel to the second heading angle and at least one of the first sub signal line and the second sub signal line has a protrusion part.

6. The display panel of claim 5, wherein the first signal line comprises a third sub signal line and a fourth sub signal line parallel to the second heading angle.

7. The display panel of claim 1, wherein a width of the second signal line is equal to a width of the first signal line.

8. The display panel of claim 7, wherein an orthogonal projection of the first signal line on the substrate overlaps with an orthogonal projection of the second signal line on the substrate.

9. The display panel of claim 1, wherein a number of the second signal lines is greater than a number of the first signal lines.

10. The display panel of claim 1, wherein the polarizer comprises a line polarization layer and a phase compensation layer, and the phase compensation layer is located at a side of the line polarization layer, which faces the display panel body.

11. The display panel of claim 10, wherein the phase compensation layer comprises stacked a half-wave plate and a quarter-wave plate.

12. The display panel of claim 11, wherein a phase delay coefficient of the half-wave plate is between 100 nm to 300 nm, and a phase delay coefficient of the quarter-wave plate is between 50 nm to 200 nm.

13. The display panel of claim 10, wherein the phase compensation layer comprises stacked a quarter-wave plate and a C-type phase compensation layer.

14. The display panel of claim 13, wherein a phase delay coefficient of the quarter-wave plate is between 50 nm to 200 nm and a phase delay coefficient of the C-type phase compensation layer is between 0 nm to 200 nm.

15. A display device comprising a display panel, the display panel comprising:
- a display panel body, comprising a metal layer having a reflection area corresponding to a first heading angle larger than a reflection area corresponding to a second heading angle; and
- a polarizer, placed in a direction of outgoing light of the display panel body; wherein a light extinction of the polarizer corresponding to the first heading angle is greater than a light extinction of the polarizer corresponding to the second heading angle.

16. The display device of claim 15, wherein the display panel body further comprises a substrate, the metal layer is placed on the substrate and the metal layer comprises:
- a first source/drain layer, placed on the substrate, the first source/drain layer comprising at least one first signal line along the second heading angle;
- a second source/drain layer, placed on the first source/drain layer, the second source/drain layer comprising at least one second signal line parallel to the first signal line;
- wherein an orthogonal projection of the second signal line on the substrate at least partially overlaps with an orthogonal projection of the first signal line on the substrate such that a reflection area of the metal layer in the first heading angle is larger than a reflection area of the metal layer in the second heading angle.

17. The display device of claim 16, wherein a width of the second signal line is equal to a width of the first signal line.

18. The display device of claim 15, wherein the polarizer comprises a line polarization layer and a phase compensation layer, and the phase compensation layer is located at a side of the line polarization layer, which faces the display panel body.

19. The display device of claim 18, wherein the phase compensation layer comprises stacked a half-wave plate and a quarter-wave plate.

20. The display device of claim 18, wherein the phase compensation layer comprises stacked a quarter-wave plate and a C-type phase compensation layer.

* * * * *